United States Patent [19]

Cho

[11] Patent Number: 5,654,936

[45] Date of Patent: Aug. 5, 1997

[54] CONTROL CIRCUIT AND METHOD FOR CONTROLLING A DATA LINE SWITCHING CIRCUIT IN A SEMICONDUCTOR MEMORY DEVICE

[75] Inventor: Ho-Yeol Cho, Seoul, Rep. of Korea

[73] Assignee: Samsung Electronics Co., Ltd., Rep. of Korea

[21] Appl. No.: 655,200

[22] Filed: May 28, 1996

[30] Foreign Application Priority Data

May 25, 1995 [KR] Rep. of Korea ............... 13265/1995

[51] Int. Cl.$^6$ ............................................. G11C 8/00
[52] U.S. Cl. .................. 365/233.5; 365/193; 365/194; 365/235; 365/238.5
[58] Field of Search ........................ 365/233.5, 235, 365/238.5, 193, 194

[56] References Cited

U.S. PATENT DOCUMENTS

| | | | |
|---|---|---|---|
| 5,327,387 | 7/1994 | Sugiura et al. | 365/222 |
| 5,398,213 | 3/1995 | Yeon et al. | 365/238.5 |
| 5,436,865 | 7/1995 | Kitazawa | 365/194 |

*Primary Examiner*—David C. Nelms
*Assistant Examiner*—H. Nguyen
*Attorney, Agent, or Firm*—Marger, Johnson, McCollom & Stolowitz, P.C.

[57] ABSTRACT

The present invention relates to a control circuit and method for controlling a data line switching circuit in a semiconductor memory device having a memory cell array, a row decoder for designating a row of a memory cell, a column decoder for designating a column thereof, a bit line sense amplifier which senses a signal of a bit line and amplifies it, and a column selection gate circuit which comprises a plurality of MOS transistors and selectively applies output signals of the bit line sense amplifier to input/output lines via a MOS transistor gated by an output signal of the column decoder among the plurality of MOS transistors. The device includes: an input/output sense amplifier for sensing read data and amplifying it to thereby transmit amplified data to a data line; an address transition detector for detecting a transition of a column address to thereby generate an address transition signal; a data line switching circuit for selecting data amplified through the input/output sense amplifier and transmitting selected data; a first delay circuit for time-delaying a column address strobe signal; a second delay circuit for time-delaying the address transition signal; and a control circuit for controlling the data line switching circuit with a signal obtained by logically combining output signals of the first delay circuit and the second delay circuit.

10 Claims, 4 Drawing Sheets

CONTROL CIRCUIT AND METHOD FOR CONTROLLING A DATA LINE SWITCHING CIRCUIT IN A SEMICONDUCTOR MEMORY DEVICE

BACKGROUND OF THE INVENTION

1. Field of the Invention

The present invention relates to a semiconductor memory device, and more particularly, to a control circuit and method for controlling a data line switching circuit to secure a stable data output and prevent data by an invalid address from being output, when data read from a memory cell is transmitted to a data output buffer through a sensing circuit in a hyper page mode.

The present application for a control circuit and method for data line switching circuit in a semiconductor memory device is based on Korean Application No. 13265/1995 which is incorporated herein by reference for all purposes.

2. Description of the Related Art

With the high speed and multifunction operation of a microprocessor having an operating frequency of more than 100 MHz, semiconductor memory devices are required to have low access times and high bandwidth. In order to meet this demand, a high speed page mode function was developed for memory devices which allows data within the same "page" to be output at a high rate of speed. Nevertheless, there is a limitation in achieving desirable output rates. Accordingly, in order to overcome this limitation, memory devices having a hyper page mode function capable of providing greater bandwidth than the high speed page mode function have been developed.

The hyper page mode function is in described in detail in a data book owned by the SAMSUNG Electronics Co., Ltd under the heading "Extended Data Out DRAM." Hyper page mode is also referred to as EDO (extended data output) mode, however, it is referred to as hyper page mode in the present application. A description of the hyper page mode function as compared with the high speed page mode is as follows. In the following description an exclamation point (!) denotes a logical negation, which is also indicated by a horizontal bar over a signal name in the drawings. In the hyper page mode, even when a column address strobe signal !CAS is disabled, output data is not changed to a high impedance state. Instead, the output data maintains its own state value even after the column address changes. Next, if the column address strobe signal !CAS is enabled, data by a new column address is output after a given time delay. At this time, if an invalid column address is provided to the device, invalid data may be generated prior to valid data. This deteriorates output characteristics of a chip having the hyper page mode function.

FIG. 1 is a block diagram illustrating a memory device including a prior art control circuit and method for controlling a data line switching circuit. The memory device of FIG. 1 includes a separate decoder for selecting a row and a column, an address transmission detector ATD that detects a transition of an address signal and the row decoder designates data to be stored in a memory cell array. The memory device also includes a bit line sense amplifier that senses designated data and amplifies it to thereby output the amplified data. A column selection gate 25 comprises a plurality of MOS transistors which have output signals of the bit line sense amplifier applied at drains thereof. The column decoder designates specific MOS transistors among a plurality of MOS transistors of the column selection gate 25 and gates the designated MOS transistors so that input/output signals I/O and !I/O are selected.

An input/output sense amplifier senses input/output signals IO and !I/O selected in the column selection gate 25 and amplifies them, and a delay circuit receives a column address strobe signal !CAS and time-delays it, thereby controlling a data line switching circuit 10 which switches the signal amplified in the I/O sense amplifier to thereby output the sensed data to a data output buffer. A latch circuit 20 comprises a chain of inverters which latch signals output via the data line switching circuit 10 switched by a signal $\phi$CD and the signal amplified in the I/O sense amplifier. In FIG. 1, it should be noted that the signal $\phi$CD for controlling the data line switching circuit is generated by the first delay circuit receiving the column address strobe signal !CAS. A data output buffer buffers the signal latched by the latch 20. A data line switching method as shown in FIG. 1 has been applied to a wide 4 megabit DRAM that is a product of a Samsung Electronics Co., LTD.

FIG. 2 illustrates an operation timing diagram of the prior art control circuit for controlling the data line switching circuit in the conventional hyper page mode. The operation characteristic of FIG. 1 is explained through FIG. 2 as follows. As stated previously, in the hyper page mode, though the column address strobe signal !CAS is disabled, i.e., logic "high" state, data output in the former read cycle is not changed to the high impedance state but holds the value thereof. In a period where the column address strobe signal !CAS is disabled, the signal $\phi$CD is in a logic "low" state. Accordingly, the data line switching circuit 10 is turned off and data of the former cycle is retained by the latch circuit 20. The output state is thereby maintained. This is a characteristic of the hyper page mode function that results from the data output buffer being continuously enabled even when the column address strobe signal !CAS is disabled.

On the other hand, when the column address signal ADD is transmitted, the address transition detector ATD detects such a state change and generates various kinds of pulses, each having a predetermined time period. The technique of controlling a data output by using an address transition signal !$\phi$ATS detected by the address transition detector ATD is disclosed by the Toshiba Corporation in U.S. Pat. No. 4,858,197, incorporated herein by reference. As described therein, the address transition signal !$\phi$ATS is a negative pulse having a given time period generated in response to a transition of the external column address. The address transition detector ATS generates !$\phi$ATS by combining an auto pulse (not shown), which is delayed relative to the address transition by a given time period, together with a valid column address j, as shown in FIG. 2. In this case, the column address signal applied from outside the chip is input within the chip only where a column address latch signal $\phi$YAL is at a logic "low" state, which is determined by the state of the !CAS signal. Therefore, in a period where the $\phi$YAL signal is a logic "high" state, the address applied from outside is not input within the chip and also the !$\phi$ATS signal generated in response to such an address is not generated because the address provided to the ATS did not change.

In a situation when the !$\phi$ATS signal is the logic "high" state, data is changed to the input/output signals I/O and !I/O while passing from the memory cell array through the bit line sense amplifier and is then amplified by the I/O sense amplifier to thereby be transmitted to data lines DO and !DO. Next, if the valid column address j is input, the !$\phi$ATS goes to a logic "low" state and then has a negative pulse width of a given period. At the same time, the I/O sense amplifier is disabled by the !$\phi$ATS during the same pulse period. At this time, the data line switching circuit 10 is turned off due to the φCD signal being supplied as the logic "low" state and therefore, the data lines DO and !DO and the data output buffer are electrically isolated. Accordingly, it should be noted that the φCD signal must maintain the logic "low" state during a given time period, i.e., 3–5 ns, after the φATS signal is again changed to the logic "high" state. This is because a time of 3–5 ns is required for the I/O sense amplifier to amplify data and the valid data to propagate to the switching circuit 10. The !φATS signal is combined with the signal acting as a decoded valid column address j while again being supplied as a logic "high" state, to thereby enable the I/O sense amplifier. That is, the data in the memory cell selected by the column address j is amplified. The signal φCD, which is used as both a signal for controlling the data line switching circuit 10 and a delay signal of the column address strobe signal !CAS, is supplied to the switching circuit 10 at the logic "high" state. Accordingly, data amplified in the I/O sense amplifier is transmitted through the data line switching circuit 10 to the data output buffer, and thereby updated data is output.

If, on the other hand, valid column address j is provided after address transition signal !φATS again changes from a logic "low" state to a logic "high" state, for example, if a valid address setup time occurs thereafter, data by the invalid column address i is transmitted through the I/O sense amplifier to the data lines DO and !DO when φCD is at a logic "high" state. This causes a problem in that data by the invalid column address i is output to a data output terminal through the data output buffer. This problem is illustrated in FIG. 2 where the invalid data produced by the invalid column address i is output during a period Q. This phenomenon occurs when !φATS changes from a logic "low" state to a logic "high" state before the signal φCD. Accordingly, in the semiconductor memory device having the prior art control circuit for controlling the data line switching circuit, there is a problem that data by the invalid column address i is output through the data output buffer to the data output terminal.

SUMMARY OF THE INVENTION

Accordingly, it is an object of the present invention to provide a semiconductor memory device including a control circuit for controlling a data line switching circuit having a stable data output characteristic by controlling a data line switching circuit during hyper page mode operation.

It is another object of the present invention to provide a control method of a semiconductor memory device including a control circuit for controlling a data line switching circuit in order to prevent a deterioration of a data output characteristic due to an input of an invalid address.

To achieve these and other objects according to the principles of the present invention, a semiconductor memory device having a memory cell array, a row decoder which designates a row of memory cell array, a column decoder which designates a column thereof, a bit line sense amplifier which senses a signal of a bit line and amplifies it, a column selection gate circuit which comprises a plurality of MOS transistors. The column selection gate selectively applies output signals of the bit line sense amplifier to input/output lines via MOS transistors gated by an output signal of the column decoder among the plurality of MOS transistors. An input/output sense amplifier senses read data and amplifies it thereby transmitting amplified data to a data line. An address transition detector which detects a transition of a column address to thereby generate an address transition signal !φATS. A dam line switching circuit which selects data amplified through the input/output sense amplifier thereby transmits selected data. A first delay circuit time-delays a column address strobe signal and a second delay circuit time-delays the address transition signal !φATS. A control circuit for controlling the data line switching circuit logically combines output signals of the first delay circuit and the second delay circuit to thereby gate the data line switching circuit with the logically combined signal.

BRIEF DESCRIPTION OF THE DRAWINGS

A more complete appreciation of this invention, and many of the attendant advantages thereof, will be more apparent by reference to the following detailed description considered together with the accompanying drawings, in which like reference symbols represent the same or similar elements, and wherein.

DETAILED DESCRIPTION OF THE PREFERRED EMBODIMENT

Figure 1:
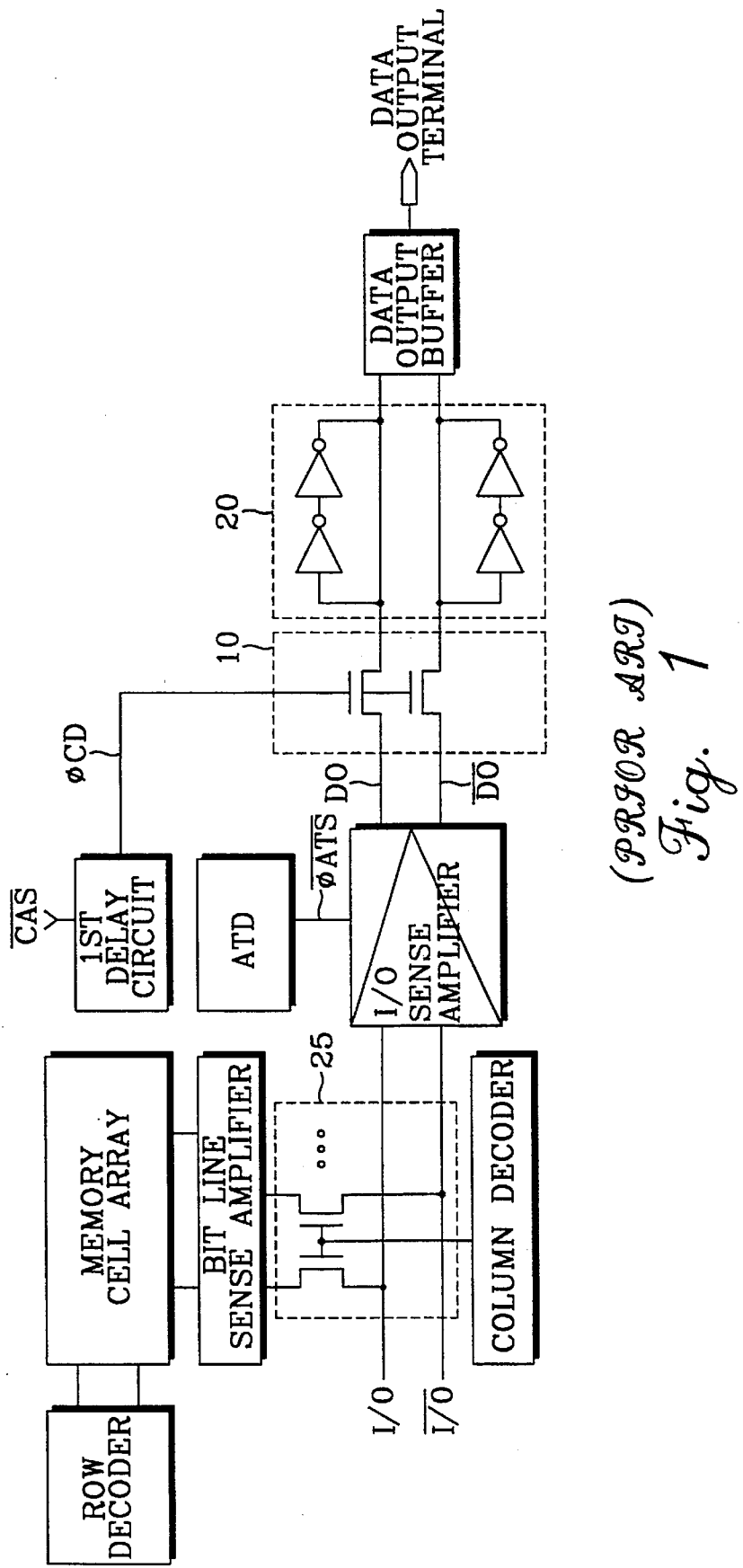
FIG. 1 is a block diagram illustrating a prior art control circuit and method for controlling a data line switching circuit in a semiconductor memory device.
Figure 3:
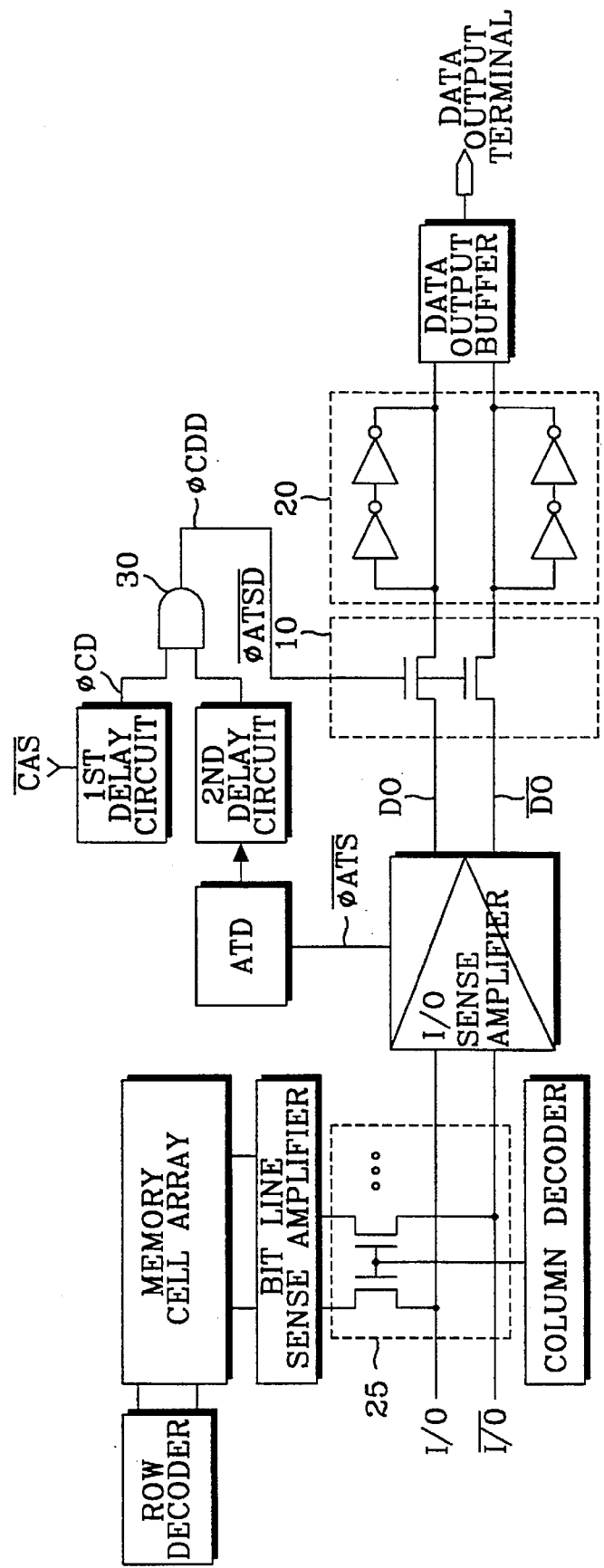
FIG. 3 is a block diagram illustrating a control circuit and method for controlling a data line switching circuit in a semiconductor memory device according to the present invention.

Referring now to FIG. 3, a block diagram of a memory device having a control circuit and method for controlling a data line switching circuit in accordance with the present invention is shown. The memory device shown in FIG. 3 is similar to that shown in FIG. 1, but additionally includes a control circuit for controlling the data line switching circuit which comprises a first delay circuit, a second delay circuit, and an AND gate 30. The first delay circuit receives a column address strobe signal !CAS and delays a leading edge thereof by a predetermined time-delay. The second delay circuit receives an address transition signal !φATS from an address transition detector and time-delays it by a predetermined period of time to produce a delayed address transition signal !φATSD. The AND gate 30 combines the signals supplied from the first and the second delay circuits (φCD and !φATSD) according to its logical AND function to thereby output a signal φCDD for controlling a data line switching circuit 10.

Figure 4:
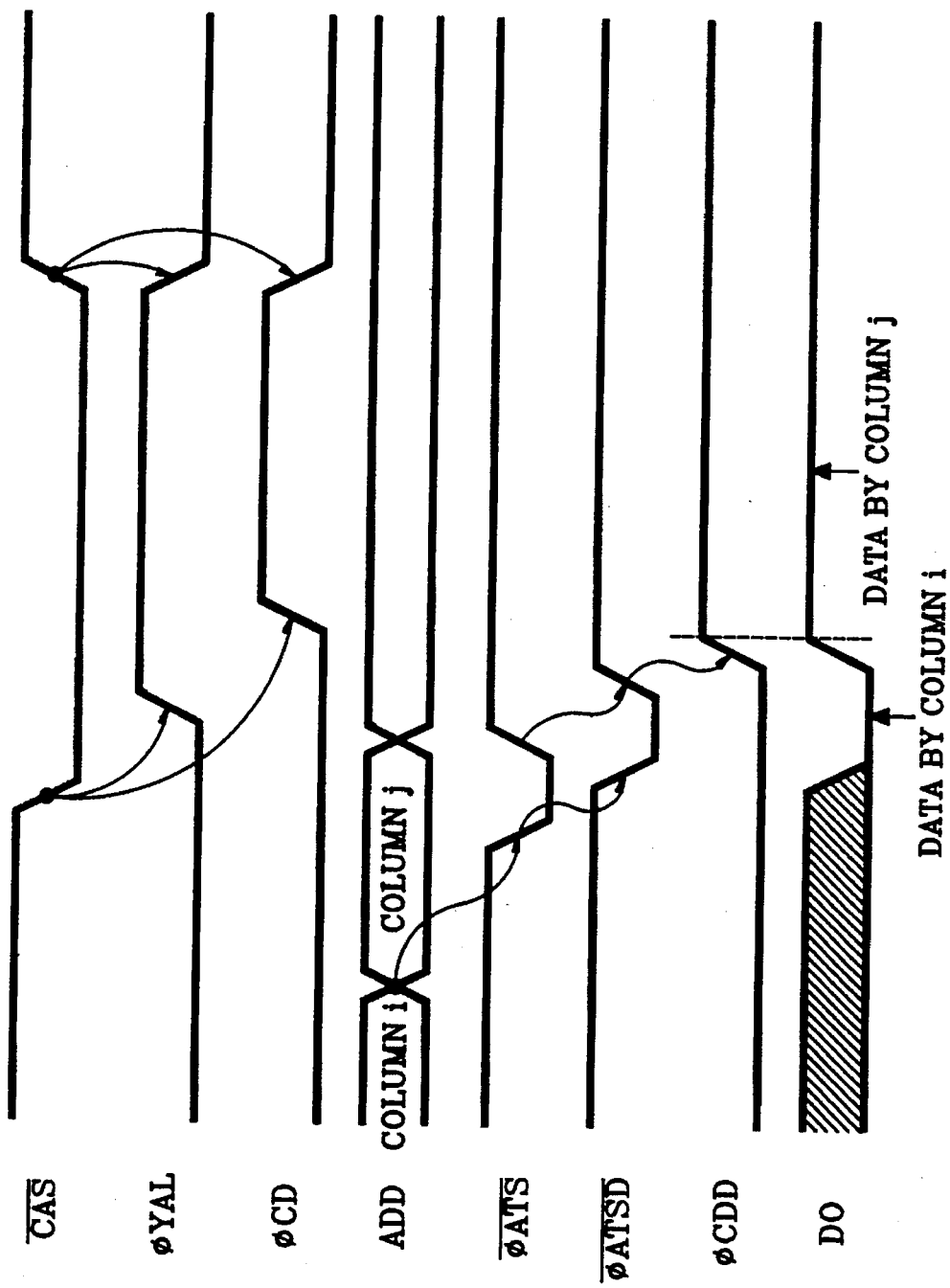
FIG. 4 is an operation timing diagram of FIG. 3.

The memory device of FIG. 3 operates as follows. Some of the operations are similar to those of the device in FIG. 1 and are therefore not repeated. The operation can best be explained with reference to the timing diagram of FIG. 4. Data read from the memory cell is transmitted to the data output buffer via the input/output sense amplifier and the data line switching circuit 10. As can be seen in FIG. 4, an invalid column address signal (COLUMNi) is received prior to a valid column address signal (COLUMNj) during the period where the column address strobe signal !CAS is at a logic "high" level. If the valid column address j is input, the address transition detector detects the transition of the address to thereby generate the address transition signal !φATS, which is a negative pulse signal. The signal !φATS is then time-delayed by the second delay circuit to produce an in-phase signal !φATSD. The signal φCD, however, goes to a logic "high" state a given time after the !φATSD changes from a logic "low" state to a logic "high" state. The φCD and !φATSD signals are provided to the AND gate 30 and logically ANDed together to thereby produce the signal φCDD, as shown in FIG. 4. The signal φCDD changes to a logic "high" state by the !φATSD after the !φATSD is changed from a logic "low" state to a logic "high" state.

Figure 2:
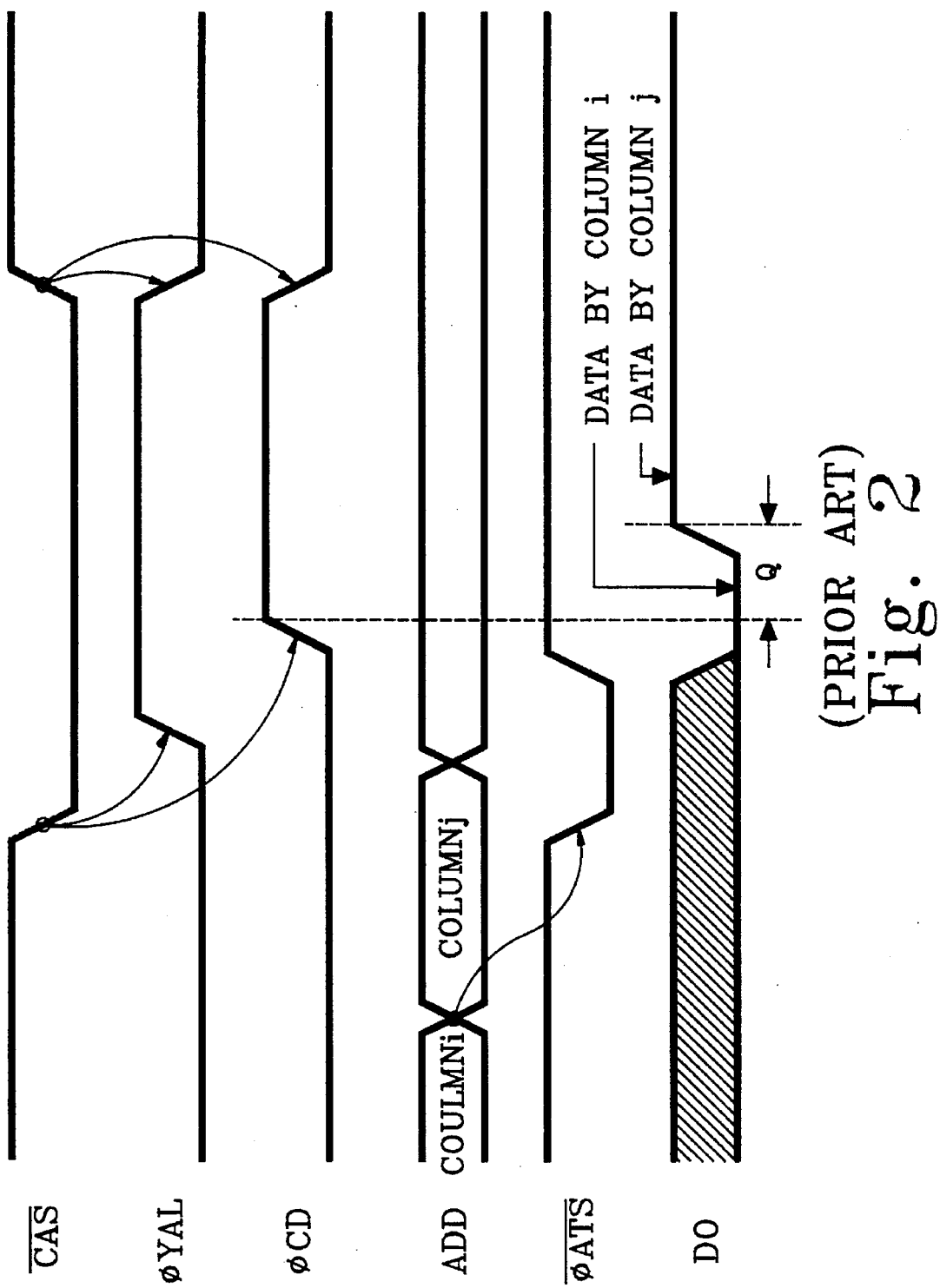
FIG. 2 is an operation timing diagram of FIG. 1.

Accordingly, the time that data on the data lines DO and !DO generated responsive to the valid column address j are transmitted to the data output buffer is delayed compared with the operation timing diagram shown in FIG. 2 since the φCDD signal controls the gate of the MOS transistor in the data line switching circuit 10. That is, the period Q (FIG. 2) where the invalid data was output by the prior art memory device has been eliminated. Accordingly, the output of invalid data is prevented and therefore, a stable data output characteristic can be obtained. In these operations in accordance with the present invention, the time delay in the second delay circuit generating the !φATSD signal, which causes the φCDD signal to be transmitted to a logic "high" state, is set in consideration of the time of approximately 3–5 ns required for the input/output sense amplifier to amplify data.

Therefore, it should be understood that the present invention is not limited to the particular embodiment disclosed herein as the best mode contemplated for carrying out the present invention, but rather that the present invention is not limited to the specific embodiment described in this specification except as defined in the appended claims.

What is claimed is:

1. A control circuit for a semiconductor memory device having a memory cell array, a row decoder for designating a row of said memory cell array, a column decoder for designating a column thereof, a bit line sense amplifier that senses a signal of a bit line and amplifies it, and a column selection gate circuit which comprises a plurality of MOS transistors and selectively applies output signals of said bit line sense amplifier to input/output lines via MOS transistors gated by an output signal of said column decoder among said plurality of MOS transistors, said control circuit including:

an input/output sense amplifier for sensing read data and amplifying it to thereby transmit amplified data to a data line;

an address transition detector for detecting a transition of a column address to thereby generate an address transition signal;

a data line switching circuit for selecting data amplified through said input/output sense amplifier and transmitting selected data;

a first delay circuit for time-delaying a column address strobe signal;

a second delay circuit for time-delaying said address transition signal; and a logical circuit coupled to the first and second delay circuits for controlling said data line switching circuit with a signal obtained by logically combining output signals of said first delay circuit and said second delay circuit.

2. A control circuit according to claim 1, wherein said logical circuit includes an AND gate.

3. A control circuit according to claim 1, wherein said second delay circuit delays the said address transition signal by a time period sufficient for said input/output sense amplifier to amplify data.

4. A control circuit according to claim 1, wherein said second delay circuit delays the said address transition signal by a time period of less than or equal to approximately 5 nanoseconds.

5. A control circuit according to claim 1, wherein said second delay circuit delays the said address transition signal by a time period of greater than or equal to approximately 3 nanoseconds.

6. A control circuit according to claim 1, wherein said second delay circuit delays the said address transition signal by a time period of equal to approximately 3 to 5 nanoseconds inclusive.

7. A data line control method of a semiconductor memory device having a memory cell array, said method comprising the steps of:

sensing a transition of a column address;

generating an address transition signal responsive to a sensed column address transition;

selecting read data within the memory cell array in response to the column address;

amplifying said selected read data;

time-delaying a column address strobe signal to produce a time-delayed column address strobe signal;

time-delaying said address transition signal to produce a time-delayed address transition signal;

logically combining the time-delayed address transition signal and the time-delayed column address strobe signal to produce a logically combined signal; and providing the amplified read data to a data output terminal responsive to the logically combined signal.

8. A method according to claim 7, wherein the step of a logically combining the time-delayed address transition signal and the time-delayed column address strobe signal to produce a logically combined signal includes logically ANDing the time-delayed address transition signal and the time-delayed column address strobe signal to produce the logically combined signal.

9. A method according to claim 7, wherein the step of time-delaying said address transition signal to produce a time-delayed address transition signal includes timedelaying said address transition signal until after the step of amplifying said selected read data is complete.

10. A method according to claim 7, wherein the step of time-delaying said address transition signal to produce a time-delayed address transition signal includes time-delaying said address transition signal for between 3 to 5 nanoseconds inclusive.

* * * * *

UNITED STATES PATENT AND TRADEMARK OFFICE
CERTIFICATE OF CORRECTION

PATENT NO. : 5,654,936
DATED : August 5, 1997
INVENTOR(S) : Cho

It is certified that error appears in the above-indentified patent and that said Letters Patent is hereby corrected as shown below:

Column 2, line 2, change "IO" to --I/O--;

Column 4, line 1, change "dam" to --data--.

Signed and Sealed this

Third Day of March, 1998

*Attest:*

BRUCE LEHMAN

*Attesting Officer*        Commissioner of Patents and Trademarks

UNITED STATES PATENT AND TRADEMARK OFFICE
CERTIFICATE OF CORRECTION

PATENT NO.     : 5,654,936
DATED          : August 5, 1997
INVENTOR(S)    : Cho

It is certified that error appears in the above-identified patent and that said Letters Patent is hereby corrected as shown below:

Column 2,
Line 2, "signals IO" should read -- signals I/O --.

Column 4,
Line 1, "A dam line" should read -- A data line --.

Signed and Sealed this

Twenty-third Day of July, 2002

Attest:

Attesting Officer

JAMES E. ROGAN
Director of the United States Patent and Trademark Office